(12) United States Patent
Nakamura

(10) Patent No.: US 6,542,532 B1
(45) Date of Patent: Apr. 1, 2003

(54) SEMICONDUCTOR LASER DEVICE CAPABLE OF REDUCING COUPLING LOSS RESPECT TO OPTICAL FIBER

(75) Inventor: Takahiro Nakamura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/294,967

(22) Filed: Apr. 20, 1999

(30) Foreign Application Priority Data

Apr. 21, 1998 (JP) .......................................... 10-110597

(51) Int. Cl.⁷ ................................................. H01S 5/00
(52) U.S. Cl. ...................................................... 372/50
(58) Field of Search ............................. 372/50, 46, 45, 372/96

(56) References Cited

U.S. PATENT DOCUMENTS

| | | | | |
|---|---|---|---|---|
| 4,689,797 A | * | 8/1987 | Olshansky | 372/45 |
| 4,726,031 A | * | 2/1988 | Wakao et al. | 372/96 |
| 5,574,289 A | * | 11/1996 | Aoki et al. | 372/50 |

FOREIGN PATENT DOCUMENTS

| | | | | |
|---|---|---|---|---|
| JP | 60-105289 | 6/1985 | ............ | H01S/3/18 |
| JP | 5-291695 | 11/1993 | ............ | H01S/3/18 |
| JP | 7-162074 | 6/1995 | ............ | H01S/3/18 |
| JP | 7-235722 | 9/1995 | ............ | H01S/3/18 |
| JP | 9-61652 | 3/1997 | ............ | G02B/6/13 |
| JP | 10-22577 | 1/1998 | ............ | H01S/3/18 |

OTHER PUBLICATIONS

"Spot–size Expanded High Efficiency 1.3um MQW Laser Diodes with Laterally Tapered Active Stripe" Uda et al IEEE; 1997; pp. 657–660 (No month available).

* cited by examiner

*Primary Examiner*—Quyen Leung
(74) *Attorney, Agent, or Firm*—Hayes Soloway P.C.

(57) ABSTRACT

A semiconductor laser device includes an electron carrying layer formed on a semiconductor substrate. An active layer which includes a first straight active layer region having a first width and a second straight active layer region having a second width is formed on the electron carrying layer. Here, the first straight active layer region is joined to the second active layer, the second width is narrower than the first width, and the active layer radiates laser light in response to an application of a voltage higher than or equal to a predetermined voltage. A hole carrying layer is formed on the active layer in contact with the active layer.

12 Claims, 10 Drawing Sheets

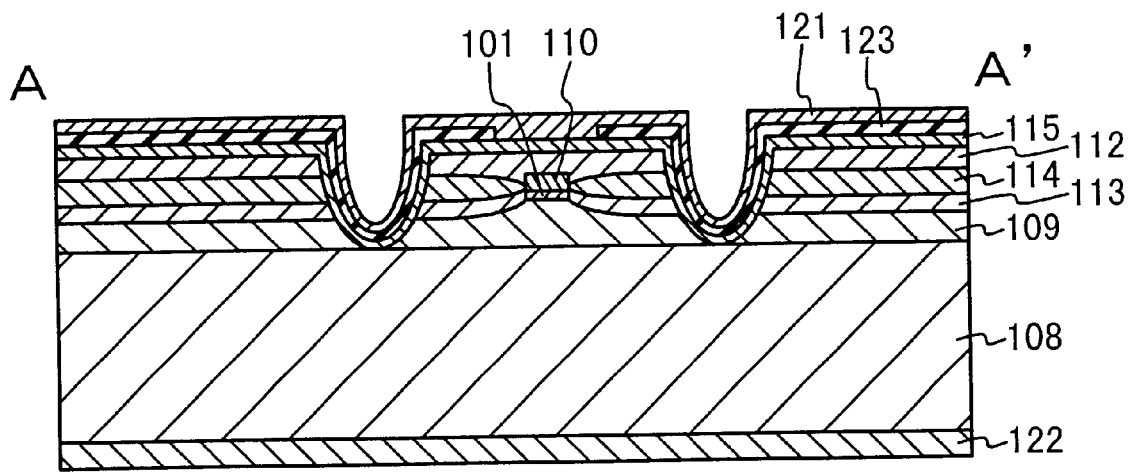
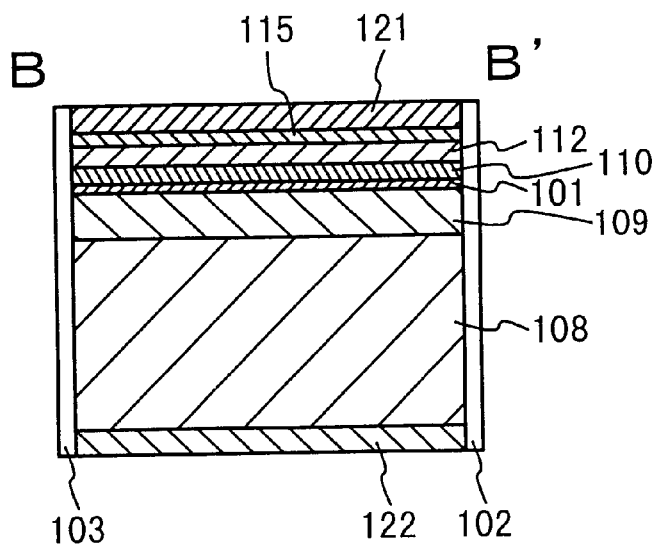

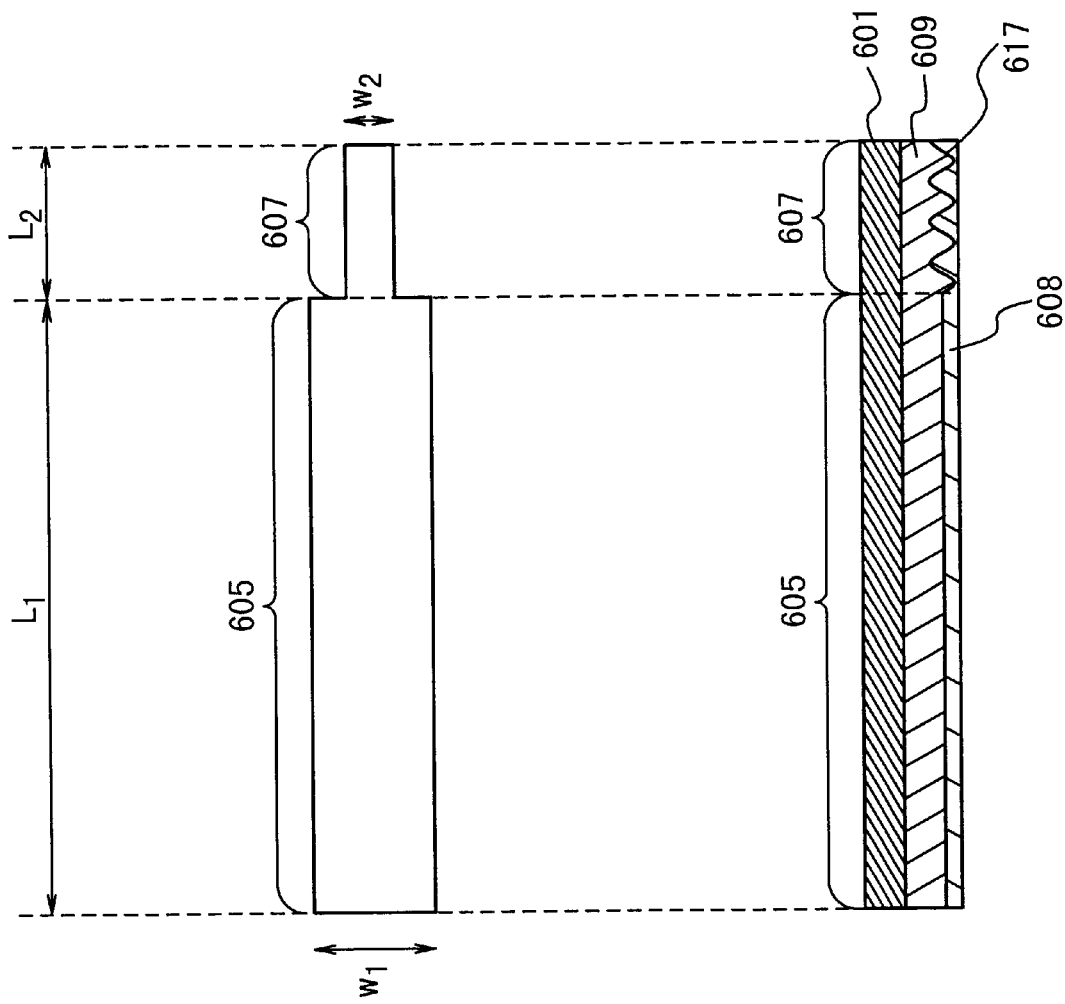

SEMICONDUCTOR LASER DEVICE CAPABLE OF REDUCING COUPLING LOSS RESPECT TO OPTICAL FIBER

BACKGROUND OF THE INVENTION

1. Field of the Invention

The present invention generally relates to a semiconductor laser device. More specifically, the present invention is related to a semiconductor laser device having high output power/high efficiency characteristics, and also superior single-mode characteristics.

2. Description of the Related Art

As a method for optically coupling a semiconductor optical waveguide device (namely, one optical function device) to a single-mode optical fiber (namely, the other optical function device), a semiconductor laser diode and a semiconductor switch are employed. In this "Butt-coupling" method, an edge surface of an optical waveguide device directly abuts against an optical fiber.

However, in accordance with this "Butt-coupling" method, since the spot sizes of the laser light propagated through the optical waveguides are different from each other, such a coupling loss indicative of the loss in the waveguide light amount would occur at the direct abutting portion.

Normally, a spot size (mode diameter) of a laser beam projected from a semiconductor device is selected to be on the order of 1 micrometer. Also, normally, a spot size of a laser beam for an optical fiber is selected to be approximately 5 micrometers. As a result, a coupling loss occurred in the "Butt-coupling" between the semiconductor optical device and the optical fiber will become approximately 10 dB.

Conventionally, as a method for reducing a coupling loss, a lens is employed for converting spot sizes of laser beams.

However, as to the coupling method with using such a lens, since tolerance in the lens alignment is small, it is practically difficult to assemble this lens with the semiconductor optical device. As a consequence, manufacturing cost of the respective modules would be increased.

In particular, very recently, application fields of semiconductor laser diodes are rapidly extended from ground transmission systems to other systems such as a subscriber system, a LAN (local area network) system, and a data link system. Under such a circumstance, a large number of semiconductor laser diode modules manufactured in low cost are necessarily required. As a consequence, total numbers of components required when one semiconductor laser diode itself is manufactured are desirably reduced. Furthermore, since the major portion of the manufacturing cost of these modules is caused by the difficult assembling work, the optical fiber is coupled with the semiconductor laser diode by employing an easy assembly by a passive alignment.

Based upon the above-described technical aspects, various sorts of optical coupling devices and various types of light sources in which optical coupling devices are integrated with semiconductor laser diodes have been developed.

For instance, the beam spot-size expanded laser diode with the laterally tapered active stripe is described in "International Conference on Indium Phosphide and Related Material, Conference Proceedings" pages 657 to 660, in 1997. In this beam spot-size expanded laser diode, the entire resonator is composed of the active layer region. And this beam spot-size expanded laser diode can oscillate laser light with the superior temperature characteristic and also the high convergence rate.

FIG. 1A illustratively shows the structure of the above-described beam spot-size expanded laser diode with the lateral tapered active stripe.

Referring now to FIG. 1A, the beam spot-size expanded laser diode has a following-described structure.

A P type InP layer 721 and an InGaAsP active layer 701 are formed on a P type InP substrate 708.

An N type InP layer 714 is formed on a P type InP layer 721.

A P type InP layer 712 is formed on an N type InP layer 714.

An N type InP layer 710 is formed on the entire surface of the element.

Furthermore, a film 703 having a low reflective power is provided on a front surface of the beam spot-size expanded laser diode.

Also, a film 702 having a high reflective power is provided on a rear surface of the beam spot-size expanded laser diode.

FIG. 1B illustratively represents the shape of the active layer 701 contained in this beam spot-size expanded laser diode with the lateral tapered active stripe.

The active layer 701 includes an active layer region 705 and a tapered active layer region 706. The tapered active layer region 706 has such a structure the width of the tapered active layer region 706 is narrowed at a region near the laser light radiation plane.

Referring now to FIG. 1A and FIG. 1B, this beam spot-size expanded laser diode with the lateral tapered active stripe owns such a structure that the width of the active layer 701 is narrowed at a region near the laser light radiation plane.

In this semiconductor laser diode, since the entire resonator corresponds to the active region, it is possible to relatively shorten the length of this semiconductor laser. As a result, this semiconductor laser diode owns an advantageous structure to have a high convergence rate. Also, this specific semiconductor laser diode may be manufactured by utilizing the same manufacturing steps for the semiconductor laser diode having the conventional uniform active layer width.

In the beam spot-size expanded laser diode with the laterally tapered active stripe, when the length of the tapered active layer region 706 is shortened while maintaining the length of the resonator at a constant value, the volume of the active layer 701 is increased. As a result, the gain of this semiconductor laser diode is increased to reduce the threshold current value and the operating current under high temperatures. Also, the shorter the length of this tapered active layer region 706 becomes, the higher the coupling degree to the radiation mode is increased to reduce the coupling efficiency of this semiconductor laser diode with respect to the optical fiber.

Other conventional semiconductor laser devices have been described as follows.

Japanese Laid-open Patent Application (JP-A-Heisei 10-22577) describes "LIGHT EMITTING SEMICONDUCTOR DEVICE". This light emitting semiconductor (laser diode) device is equipped with the beam spot-size conversion structure, and is capable of blocking such a phenomenon that the laser light leaked out from the core in the spot-size conversion region is returned to the gain region of this laser diode. Concretely speaking, this laser diode is featured by having the reflection structure capable of reflecting the scattered laser light in the vicinity of the spot-size conversion structure and the gain region. This scattered laser light is leaked out from the core and then is entered into the gain region.

Also, Japanese Laid-open Patent Application (JP-A-Heisei 9-61652) discloses "SEMICONDUCTOR OPTICAL WAVEGUIDE AND MANUFACTURING METHOD THEREOF". In the semiconductor optical waveguide and the manufacturing method thereof, when the optical element such as the semiconductor laser device is coupled to another optical element, or the optical fiber without using the lens system, the coupling efficiency can be increased. The structure of this semiconductor optical waveguide represents such a tapered shape that the thickness of the core layer of the optical waveguide is continuously changed in an exponential manner.

SUMMARY OF THE INVENTION

The present invention has been made to solve the above-explained problems.

Therefore, an object of the present invention is to provide a semiconductor laser device capable of realizing a high coupling efficiency between this semiconductor laser device and an optical fiber under a condition that this semiconductor laser device has a tapered structure of a short length.

Another object of the present invention is to provide a semiconductor laser device capable of achieving a low threshold value and a high coupling efficiency at the same time under high temperature.

In order to achieve an aspect of the present invention, a semiconductor laser device includes an electron carrying layer, an active layer, and a hole carrying layer. The electron carrying layer is formed on a semiconductor substrate. The active layer includes a first straight active layer region having a first width and a second straight active layer region having a second width. And the active layer is formed on the electron carrying layer in contact with the active layer. Here, the first straight active layer region is joined to the second straight active layer region, the second width is narrower than the first width, and an active layer radiates laser light in response to an application of a voltage higher than or equal to a predetermined voltage. A hole carrying layer is formed on the active layer in contact with the active layer.

Both of the first width and the second width may be such that the laser light in a waveguide mode interferes with the laser light in a radiation mode in the second straight active layer region.

Both straight active layer regions have only lowest guided mode.

The active layer may radiate laser light of a wavelength of $\lambda$ micrometer, the first width of the first straight active layer region may be substantially $0.923\times\lambda$ micrometer, and second width of the second active layer may be substantially $0.462\times\lambda$ micrometer.

The active layer may radiate laser light of substantially a same wavelength as 1.3 micrometer, the first straight active layer region may have the first width of substantially a same width as 1.2 micrometer, and the second active layer may have the second width of substantially a same width 0.6 micrometer.

The second active region may have a length such that a phase of the laser light in a waveguide mode is equal to a phase of the laser light in a radiation mode in the active region.

The semiconductor laser device may further include a current blocking layer formed between the electron carrying layer and the hole carrying layer.

The current blocking layer may comprise a hole blocking layer and an electron blocking layer. Here, the hole blocking layer is formed on the electron carrying layer and the electron blocking layer is formed on the hole blocking layer.

The semiconductor laser device may be coupled to a single-mode optical fiber and a coupling efficiency between the semiconductor laser device and the single-mode optical fiber is lower than, or equal to 5.0 dB.

The active layer may have a length such that a loss of the laser light propagated is smaller than or equal to 0.3 dB. Here, the loss occurs while the laser light once goes to and returns the active layer.

The semiconductor laser device may further include a diffraction grating formed under the second active region.

The active layer may radiate laser light of a wavelength of $\lambda$ micrometer and the diffraction grating may have substantially a interval of $\lambda/6.364$ micrometer.

The active layer may radiate laser light of substantially a same wavelength of 1.3 micrometer and the diffraction grating may have substantially a same interval of 204.3 nanometer.

The semiconductor laser device may be operated in a single mode such that a sub mode suppression ratio is lower than or equal to 50 dB.

BRIEF DESCRIPTION OF THE DRAWINGS

FIG. 1A shows the overall structure of the conventional lateral active taper type spot-size conversion laser, and FIG. 1B shows the shape of active layer region in the conventional lateral active taper type spot-size conversion laser;

FIGS. 2A, 2B, and 2C illustratively show a semiconductor laser device according to the first embodiment of the present invention, FIG. 2A is a perspective view of the first embodiment of the present invention, FIG. 2B is a section view taken along a line A—A' of FIG. 2A according to the first embodiment of the present invention, and FIG. 2C is a section view taken along a line B—B' of FIG. 2A according to the first embodiment of the present invention;

FIGS. 8A and 8B illustratively show a shape of an active layer in the semiconductor laser device according to the second embodiment of the present invention, FIG. 8A is a top view of an active layer, and FIG. 8B is a sectional view of an active layer.

DESCRIPTION OF THE PREFERRED EMBODIMENTS

Referring now to drawings, various preferred embodiments of the present invention will be described in detail. At first, a semiconductor laser device according to a first embodiment of the present invention will be described below.

Figure 2A:
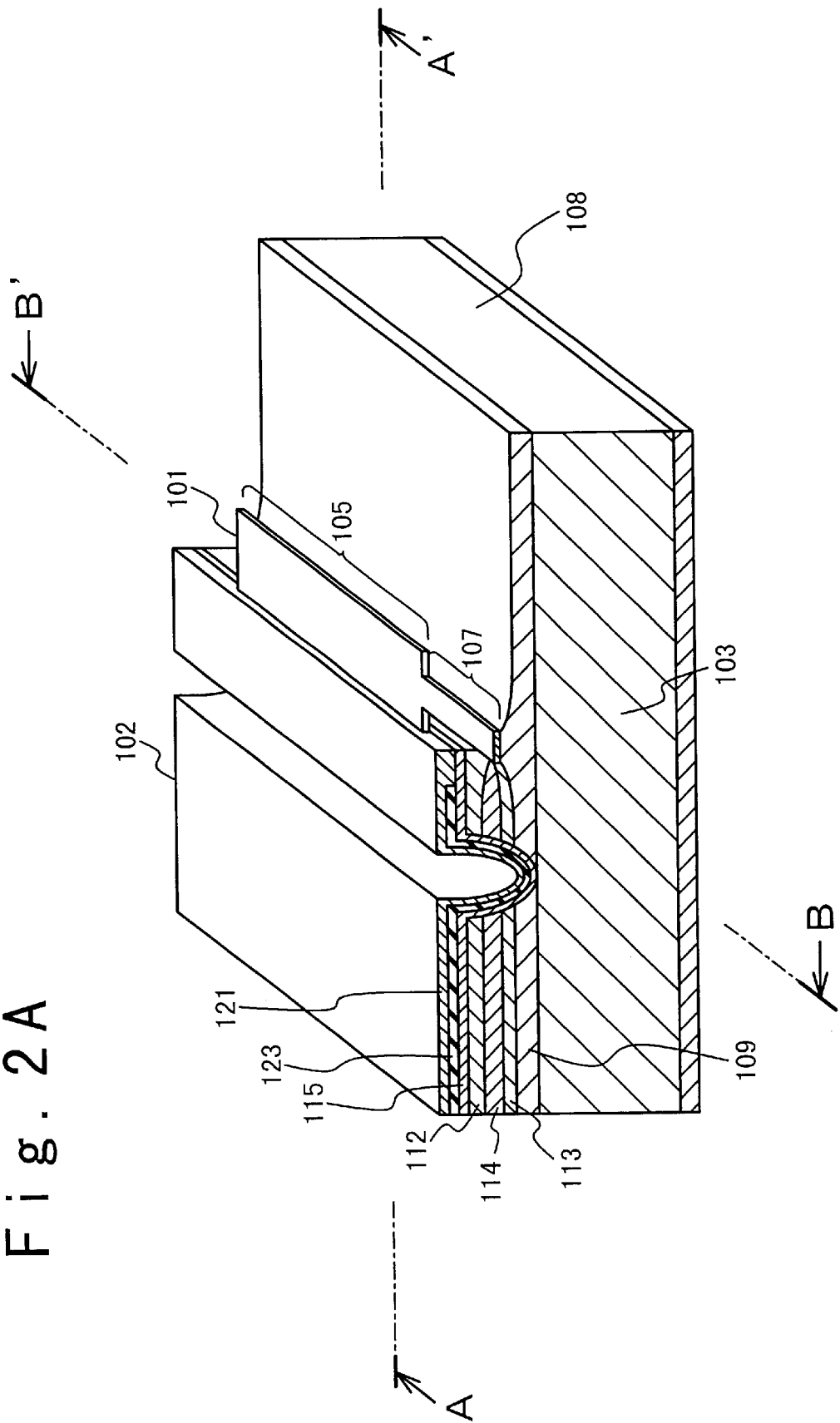

FIGS. 2A, 2B, and 2C illustratively show a semiconductor laser device according to the first embodiment of the present invention.

FIG. 2A is a perspective view of the first embodiment of the present invention.

FIG. 2B is a section view taken along a line A—A' of FIG. 2A according to the first embodiment of the present invention.

FIG. 2C is a section view taken along a line B—B' of FIG. 2A according to the first embodiment of the present invention.

A description will now be made of the overall structure of this first semiconductor laser device with reference to FIG. 2A, FIG. 2B, and FIG. 2C.

As illustrated in these drawings, an N type clad layer 109 is formed on an N type substrate 108.

Both an active layer 101 and a current blocking layer are formed on the N type clad layer 109.

A P type clad layer 110 is formed on the active layer 101.

The current blocking layer is constructed of a P type current blocking layer 113 located at a lower layer and a N type current blocking layer 114 located at an upper layer.

A P type buried layer 112 is provided on both the P type clad layer 110 and the current blocking layer.

A P type contact layer 115 is formed on the P type buried layer 112.

An insulating layer 123 is formed on the P type contact layer 115. An opening is formed in the insulating layer 123, and the opening is formed over the active layer 101.

Furthermore, a P type electrode 121 is formed on all of the opening, the P type contact layer 115, and the insulating layer 123.

The P type contact layer 115 owns a function capable of reducing a contact resistance with respect to the P type electrode 121.

Also, an N type electrode 122 is formed on a lower surface of the N type substrate 108.

A DC voltage is applied to the semiconductor laser device according to a first embodiment of the present invention by using both the P type electrode 121 and an N type electrode 122.

Furthermore, a film 103 having a low reflective power is provided on a front surface of the semiconductor laser device according to a first embodiment of the present invention.

Also, a film 102 having a high reflective power is provided on a rear surface of the semiconductor laser device according to a first embodiment of the present invention.

Figure 3:
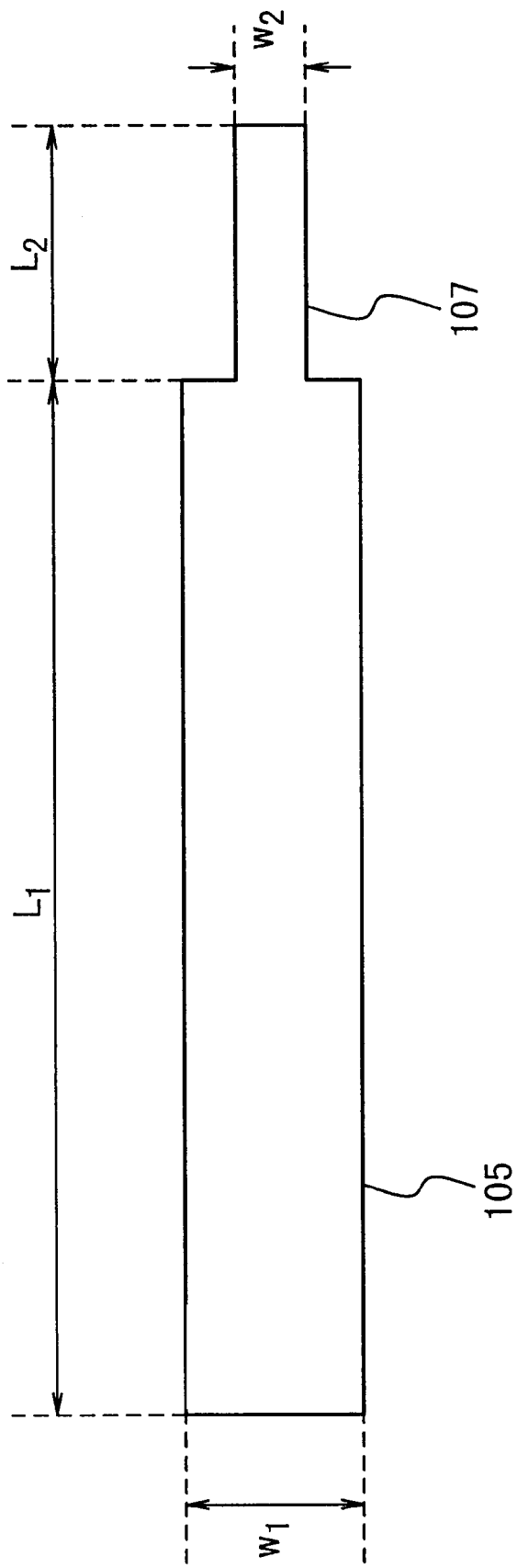
FIG. 3 illustratively shows a shape of an active layer in the semiconductor laser device according to the first embodiment of the present invention.

FIG. 3 illustratively shows a shape of the active layer 101 in the semiconductor laser device according to the first embodiment of the present invention.

A description will now be made of the structure of the active layer 101 according to the first embodiment of the present invention with reference to FIG. 3.

The active layer 101 is formed to oscillate laser light having a wavelength of $\lambda$ micrometer in response to an application of a DC voltage.

Referring now to FIG. 3, the active layer 101 is composed of a first straight active layer region 105 and a second straight active layer region 107.

The shape of the first straight active layer region 105 and the second straight active layer region 107 represent either rectangular shapes or substantially rectangular shapes.

A width "w2" of the second straight active layer region 107 is narrower than a width "w1" of the first straight active layer region 105.

In case that laser light oscillated by the above-described active layer 101 is propagated in a single mode through an optical waveguide of the above-described active layer 101, the spot size of the laser light is extended at the first straight active layer region 105. This is an object of the present invention.

Especially, the active layer 101 oscillates laser light having a wavelength of $\lambda$ micrometer, and when the width of the first straight active layer region 105 is formed to be made of 0.923×$\lambda$ micrometer and the width of the second straight active layer region 107 is formed to be made of 0.462×$\lambda$ micrometer, it will be interfered between a waveguide mode and a radiation mode of the laser light oscillated at the active layer 101 of the semiconductor laser device according to the first embodiment of the present invention.

FIGS. 4A to 4E are diagrams showing a method for manufacturing the semiconductor laser device according to the first embodiment of the present invention.

Referring to FIGS. 4A to 4E, a method of manufacturing the semiconductor laser device according to the first embodiment of the present invention will be described.

First, the N type clad layer 109 is formed on the N type substrate 108.

Next, the active layer 101 is formed on the N type clad layer 109. The active layer 101 is made of InGaAsP. The active layer 101 is constructed of a strained multiplexing quantum well layer. The active layer 101 is designed to oscillate the laser light having a wavelength of $\lambda$ micrometer.

Subsequently, the P type clad layer 110 is formed on the active layer 101.

Figure 4A:
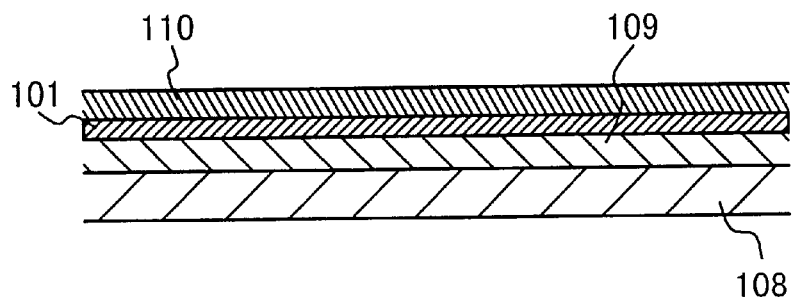
FIGS. 4A to 4E are diagrams showing a method for manufacturing the semiconductor laser device according to the first embodiment of the present invention.

After the above-explained manufacturing process steps have been accomplished, a device structure shown FIG. 4A is formed.

Figure 4B:
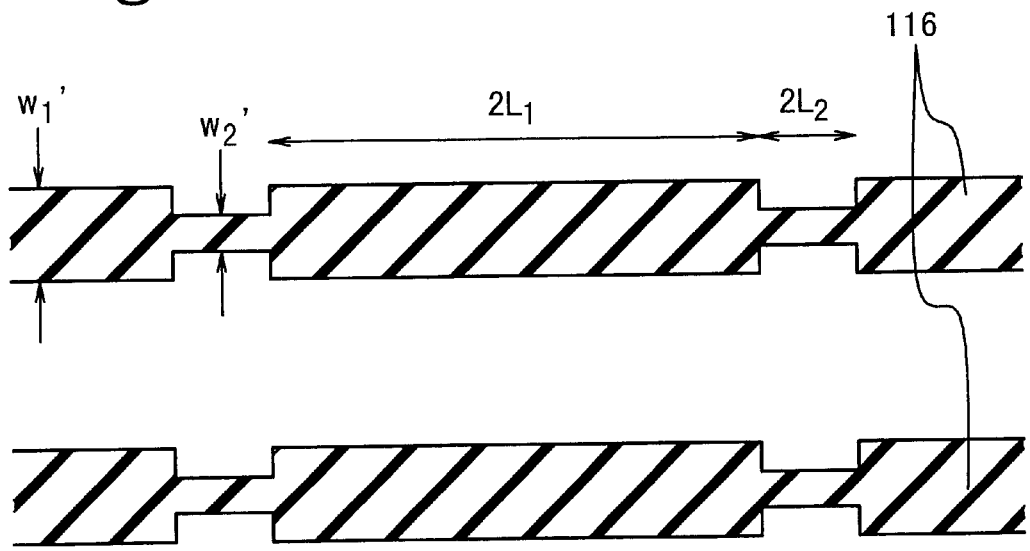

Next, an SiO$_2$ mask 116 shown in FIG. 4B is formed on the P type clad layer 110. A shape of the SiO$_2$ mask 116 is based on a shape of an active layer of a semiconductor laser device under manufacture. When an isotropic etching is utilized by using chemical reaction such as a wet etching in the below-mentioned etching method, the size of the SiO$_2$ mask 116 may be determined by considering an amount of under-cut by the isotropic etching.

Figure 4C:
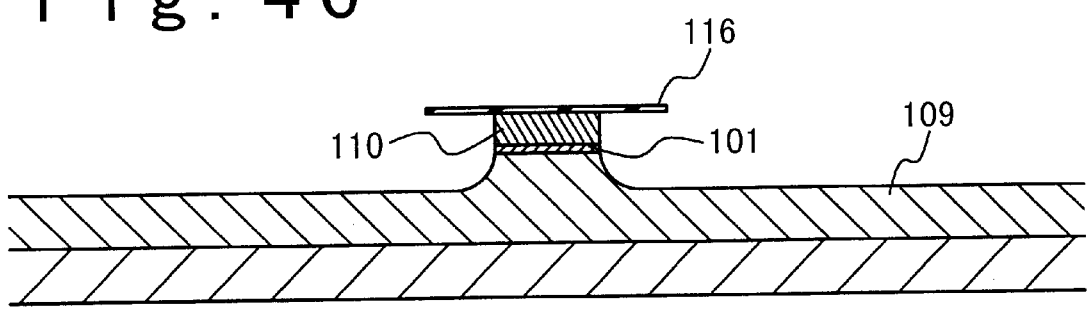

Next, a wafer on which the SiO$_2$ mask 116 is formed is wet-etched from the upper surface thereof to remove partially the active layer 101, the P type clad layer 110, and N type clad layer 109 to be formed of stripe mesa shown in FIG. 4C.

It should also be noted that the below-mentioned etching methods may be applied to the above-described etching treatment. The etching methods are adopted to the dry etching method for utilizing the chemical reactions, the anisotropic etching method for progressing the anisotropic etching treatments along a depth direction of a thin film using physical mechanics, and the ion beam etching method.

When the damage aspect with respect to the active layer 101 is considered, both the wet etching method and the dry etching method utilizing the chemical reaction are preferably utilized in the first embodiment mode.

In this case, a shape of a mask employed when the anisotropic etching method and the ion beam etching method are utilized instead of the above-explained wet etching method is not particularly illustrated in these drawings. The size of the etching mask is equal to the size of the active layer 101 to be manufactured.

Next, the P type current blocking layer 113 is formed on the N type clad layer 109.

Subsequently, the N type current blocking layer 114 is formed on the P type current blocking layer 113.

Figure 4D:
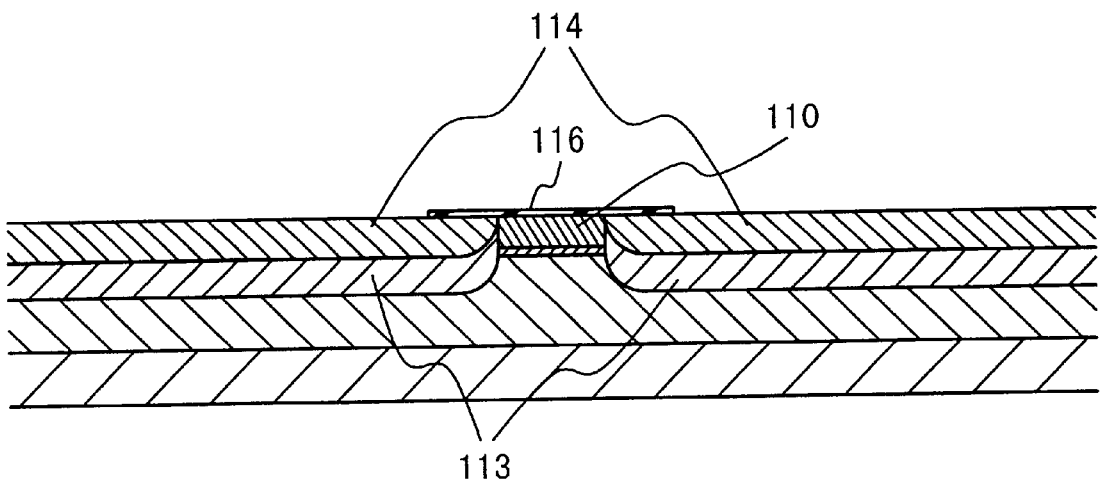

After the above-explained manufacturing process steps have been accomplished, a device structure shown FIG. 4D is formed.

Next, the SiO$_2$ mask 116 is removed.

Subsequently, the P type buried layer 112 is formed to cover the entire device structure.

Next, the P type contact layer 115 is formed on the P type buried layer 112.

Figure 4E:
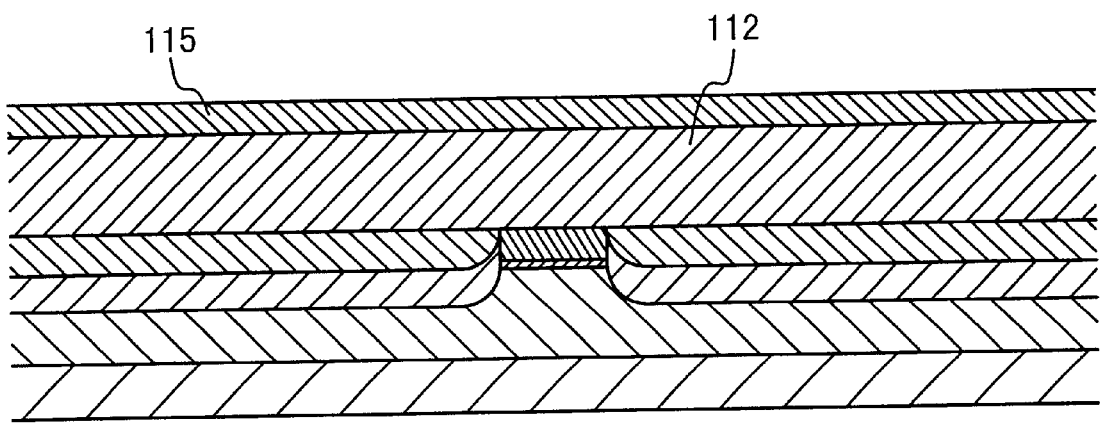

After the above-explained manufacturing process steps have been accomplished, a device structure shown FIG. 4E is formed.

Thereafter, both the P type electrode 121 and the N type electrode 112 are formed on the above-described wafer by way of the normally executed electrode manufacturing process.

Next, the resulting wafer is cleaved at the cleavage of the resulting wafer to make an element having a predetermined length. An element which is cut out from the resulting wafer owns the active layer 101 composed of both the first straight active layer region 105 and the second straight active layer region 107. For the sake of an easy explanation, a side surface where the first straight active layer region 105 is exposed is referred to as a "rear surface", and other side surface where the second straight active layer region 107 is exposed is referred to as a "front surface" in the first embodiment.

Thereafter, the low-reflectance film 103 is formed on the above-explained front surface of the cut-out element, and the high-reflectance film 102 is formed on the above-explained rear surface thereof.

According to the above-explained manufacturing steps, it is obtained the final structure of the first semiconductor laser device of the present invention represented in FIGS. 2A, 2B, and 2C.

A description will now be made of operations of the above-described semiconductor laser device according to the first embodiment of the present invention.

First, as shown in FIG. 3, in the semiconductor laser device of the first embodiment of the present invention, the active layer 101 is composed of the first straight active layer region 105 and the second straight active layer region 107.

Also, the width "w2" of the second straight active layer region 107 is narrower than the width "w1" of the first straight active layer region 105.

Laser light emitted from the active layer 101 is propagated to the first straight active layer region 105. And then the laser light is coupled to both the waveguide mode and the radiation mode of the second straight active layer region 107 thereof at a junction portion between the first straight active layer region 105 and the second straight active layer region 107. Since the transmission constant of the waveguide mode is different from that of the radiation mode, the laser light in the waveguide mode will interfere with the laser light in the radiation mode while two sets of the laser light are transmitted along the second straight active layer region 107. When the length of the second straight active layer region 107 is determined in such a manner that these two modes have an in-phase relationship, the spot size of the laser light at the edge surface of the second straight active layer region 107 is extended. As the result, the coupling efficiency of the laser light to the optical fiber can be increased.

A concrete example of the semiconductor laser device according to the first embodiment of the present invention will now be explained. In this concrete example, the oscillating wavelength of the laser light is selected to be a length of 1.3 micrometer in response to an application of a DC voltage higher than, or equal to a preselected DC voltage.

Referring now to FIGS. 2A, 2B, and 2C, one concrete structural example of the first semiconductor laser device is described as follows.

The N type substrate 108, the N type clad layer 109, the N type current blocking layer 114 are made of N type InP. This N type InP implies an InP layer into which an N type ion is injected.

The active layer 101 is made of InGaAsP, and is composed of a strained multiplexing quantum well layer. This active layer 101 is designed under such a condition that this active layer 101 is oscillated with having a wavelength of 1.3 micrometer in response to an application of a DC voltage higher than, or equal to a predetermined voltage.

The P type clad layer 110, the P type current blocking layer 113, and the P type buried layer 112 are made of P type InP. This P type InP implies an InP layer into which an P type ion is injected.

The P type contact layer 115 is made of P type InGaAsP. This P type InGaAsP implies an InGaAsP layer into which an P type ion is injected.

The above-described low-reflectance film 103 is selected to be 30 percent of the reflectance, and the above-described high-reflectance film 102 is selected to be 95 percent of the reflectance.

Referring now to FIG. 3, the active layer 101 is composed of the first straight active layer region 105 and the second straight active layer region 107.

The first straight active layer region 105 is shaped under such a condition that a length "L1" thereof is selected to be 240 micrometers, and a width "w1" thereof is selected to be 1.2 micrometer.

The second straight active layer region 107 is shaped under such a condition that a length "L2" thereof is selected to be 60 micrometers, and a width "w2" thereof is selected to be 0.6 micrometer.

An overall length of the active layer 101 is selected to be 300 micrometers.

Next, referring to FIGS. 4A to 4E, a method of manufacturing the concrete example of the semiconductor laser device according to the first embodiment of the present invention will be described.

First, the N type InP clad layer 109 is formed on the N type InP substrate 108.

Next, the active layer 101 having the thickness of 0.2 micrometer is formed on the N type InP clad layer 109. The active layer 101 is made of InGaAsP. The active layer 101 is constructed of a strained multiplexing quantum well layer. The active layer 101 is designed to oscillate the laser light having a wavelength of 1.3 micrometer.

Subsequently, the P type InP clad layer 110 is formed on the active layer 101. After the above-explained manufacturing process steps have been accomplished, a device structure shown FIG. 4A is formed.

Next, a SiO$_2$ mask 116 shown in FIG. 4B is formed on the P type InP clad layer 110. In this case, a shape of the SiO$_2$ mask 116 is made of first mask regions and second mask regions. These first and second mask regions are alternately formed in a continuous manner. The first mask region is made with having the width "w1'" of 3.2 micrometers and the length "2L1" of 480 micrometers, whereas the second mask region is made with having the width "w2'" of 2.6 micrometers and the length "2L2" of 120 micrometers.

Next, the wafer on which this SiO$_2$ mask is formed is wet-etched from the upper surface thereof to remove partially the active layer 101, the P type InP clad layer 110, and N type InP clad layer 109 to be formed of stripe mesa shown in FIG. 4C.

The width "w1" of the active layer 101 is formed to be 1.2 micrometer under the first mask region of the SiO$_2$ mask 116, and the width "w2" thereof is formed to be 0.6 micrometer under the second mask region thereof.

At this time, the etching treatment is carried out by taking account of so called "under-cut" phenomena caused by the wet etching treatment.

It should also be noted that the below-mentioned etching methods may be applied to the above-described etching treatment. The etching methods are adopted to the dry etching method for utilizing the chemical reactions, the anisotropic etching method for progressing the anisotropic etching treatments along a depth direction of a thin film using physical mechanics, and the ion beam etching method. However, when the damage aspect with respect to the active layer 101 is considered, both the wet etching method and the dry etching method with utilizing the chemical reaction are preferably utilized in the concrete example of this first embodiment mode.

In this case, a shape of a mask employed when the anisotropic etching method and the ion beam etching method are utilized instead of the above-explained wet etching method is not particularly illustrated in these drawings. The size of this etching mask is equal to the size of the active layer 101 to be manufactured.

In other words, the first mask region of the above-described SiO$_2$ mask 116 is made with having the width "w1'" of 1.2 micrometer and the length "2L1" of 480 micrometers. Whereas the second mask region of the above-described SiO$_2$ mask 116 is made with having the width "w2'" of 0.6 micrometer and the length "2L2" of 120 micrometers.

Next, the P type InP current blocking layer 113 is formed on the N type cladding layer 109 by way of the metal organic vapor phased epitaxy (MOVPE) method to have the thickness of 0.7 micrometer.

Subsequently, the N type InP current blocking layer 114 is formed on the P type InP current blocking layer 113 by way of the MOVPE method to have the thickness of 0.7 micrometer. After the above-explained manufacturing process steps have been accomplished, a device structure shown FIG. 4D is formed.

Next, the SiO$_2$ mask 116 is removed.

Subsequently, the P type InP buried layer 112 is formed on the entire device structure to have the thickness of 2.0 micrometer.

Next, the P type InGaAsP contact layer 115 is formed on the P type InP buried layer 112 to have the thickness of 0.5 micrometer. After the above-explained manufacturing process steps have been accomplished, a device structure shown FIG. 4E is formed.

Next, the insulating layer 123 is formed on the P type InGaAsP contact layer 115 and a part of the insulating layer 123 is removed to be made a opening over the active layer 101.

Thereafter, the P type electrode 121 is formed on the entire device structure, and the N type electrode 122 is formed under the N type InP substrate 108 by executing the well-known electrode manufacturing process.

Next, the resulting wafer is cleaved to make an element having a pre-selected length. At this time, the element is cut out from this wafer to be formed of such the active layer 101 that the first straight active layer region 105 has the length "L1" of 240 micrometers and the second straight active layer region 107 has the length "L2" of 60 micrometers.

For the sake of easy explanation, a side surface where the first straight active layer region 105 is exposed is referred to as a "rear surface", whereas another side surface where the second straight active layer region 107 is exposed is referred to as a "front surface" in the concrete example of this first embodiment.

Thereafter, the low-reflectance film 103 having the reflectance of 30 percent is formed on the above-explained front surface of the cut-out element, and the high-reflectance film 102 having the reflectance of 95 percent is formed on the above-explained rear surface thereof.

According to the above-explained manufacturing steps, it is obtained the concrete structure of the first semiconductor laser device of the present invention.

A description will now be made of the evaluations of the above-described semiconductor laser device according to the above-explained concrete example of the first semiconductor laser device of the present invention.

First, an evaluation is made of the semiconductor laser device according to the first embodiment mode with employment of an element manufactured based upon the below-mentioned conditions.

The active layer 101 is formed to oscillate laser light having the wavelength of approximately 1.3 micrometer.

The length of the active layer 101 is selected to be approximately 300 micrometers. The length "L1" of the first straight active layer region 105 is selected to be approximately 240 micrometers, and the length "L2" of the second straight active layer region 105 is selected to be approximately 60 micrometers.

The width "w1" of the first straight active layer region 105 is selected to be approximately 1.2 micrometer, and the width "w2" of the second straight active layer region 105 is selected to be approximately 0.6 micrometer.

The low-reflectance film 103 has the reflectance of approximately 30 percent, and the high-reflectance film 102 has the reflectance of approximately 95 percent.

When a pre-selected voltage was applied to the semiconductor laser device element capable of satisfying the above-described conditions, this semiconductor laser device element oscillates laser light having the wavelength of 1.31 micrometer.

Also, when the current-to-light output characteristics of this semiconductor laser device was evaluated, this laser device was oscillated under condition of room temperature, the threshold current value was 4.0 mA, and also the light emitting efficiency represented 0.6 W/A. Moreover this laser device was oscillated under temperature condition of 85° C., the threshold current value was 15.9 mA, and also the light emitting efficiency represented 0.4 W/A. Also, even under temperature condition of 85° C., more than 40 mW light output power could be obtained.

Moreover, as a measurement result of the coupling efficiency between this semiconductor laser device and a single-mode optical fiber having a core diameter of 10 micrometers, the coupling efficiency of −4.0 dB could be obtained in maximum. Also, in such a case that the center of the active layer of this semiconductor laser device is located apart from the center of the above-explained optical fiber by approximately 2.5 micrometers on the coupling surface, coupling efficiency was reduced by 1 dB.

To the contrary, such a semiconductor laser device was manufactured by employing the tapered active layer having the length of 60 micrometers in accordance with the conventional technique. As a measurement result of the coupling efficiency between this resultant semiconductor laser device and the optical fiber, the coupling efficiency of −6.0 dB was obtained in maximum. This implies that the coupling efficiency of the latter-mentioned laser device was deteriorated by approximately 2 dB, as compared with the semiconductor laser device of the present invention.

Figure 5:
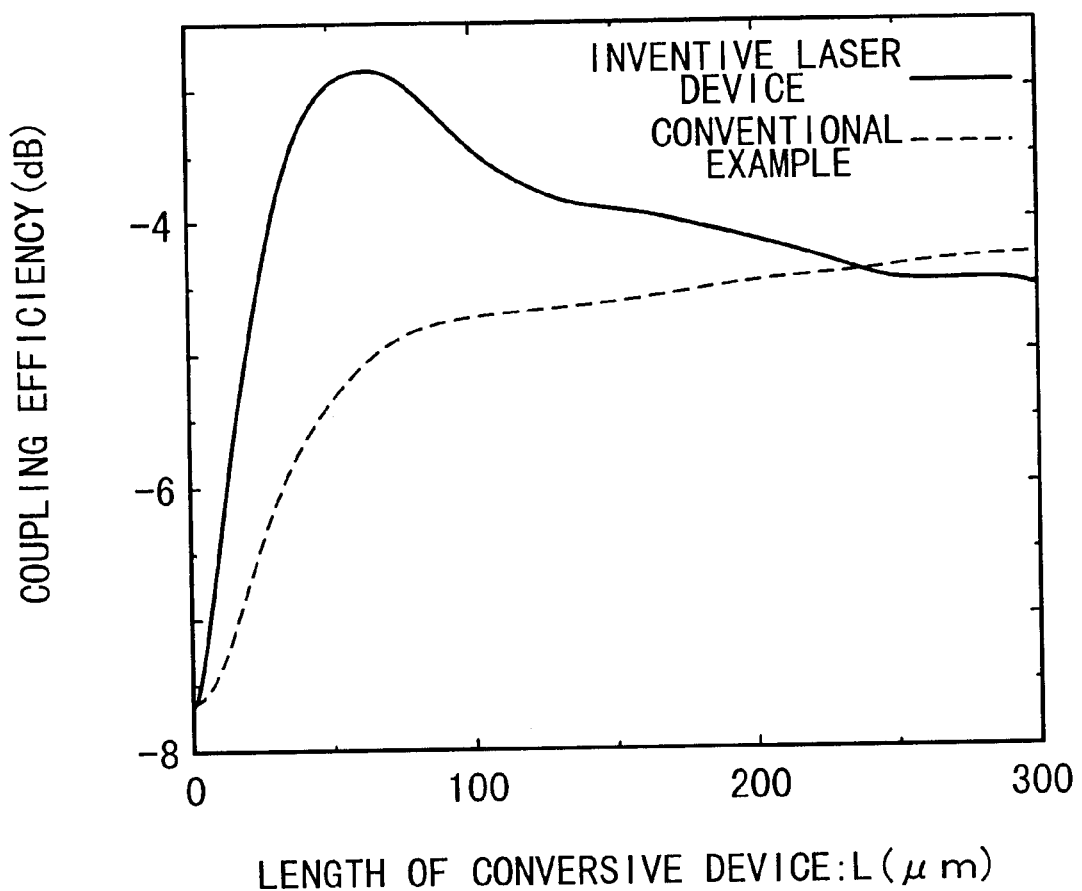
FIG. 5 is a graphic representation for showing a coupling efficiency between an optical fiber and the semiconductor laser device according to the first embodiment.

FIG. 5 graphically represents a coupling loss of laser light occurred in the above-described first semiconductor laser device. The coupling loss of laser light occurs between a single-mode optical fiber and the first semiconductor laser device manufactured when the first semiconductor laser device oscillates laser light. Here, on the first semiconductor laser device, the length of the second straight active layer region (namely, length of converting device) is selected to be "L" micrometer, and the length of the first straight active layer region 107 is selected to be 240 micrometers. It should be noted that FIG. 5 graphically represents a correlative relationship between the length "L" of the converting device and the coupling loss with respect to the single-mode optical fiber, which is calculated by introducing the 3-D beam propagation method (BPM).

While the length "L" of the converting device is varied, the coupling efficiency is attenuation-oscillated due to the phase relationship mode. As a calculation result obtained by employing the 3-D BPM, when the length "L" of the converting device is selected to be 60 micrometers, a coupling efficiency between the first semiconductor laser device and the optical fiber becomes approximately −3.0 dB. On the other hand, as a calculation result obtained by employing the 3-D BPM, when the length "L" of the converting device is similarly selected to be 60 micrometers, a coupling efficiency between the optical fiber and the semiconductor laser device with employment of the tapered active region formed by the conventional technique becomes approximately −5.9 dB. As a consequence, when the length "L" of the converting device is set to 60 micrometers, the coupling efficiency between the first semiconductor laser device and the optical fiber can be improved by approximately 3 dB, as compared with the coupling efficiency between the optical fiber and such a conventional semiconductor device with employment of the tapered active region.

Furthermore, in a semiconductor laser device, it is required to reduce a loss of the quantity of laser light while the laser light once goes to and returns the active layer.

Figure 6:
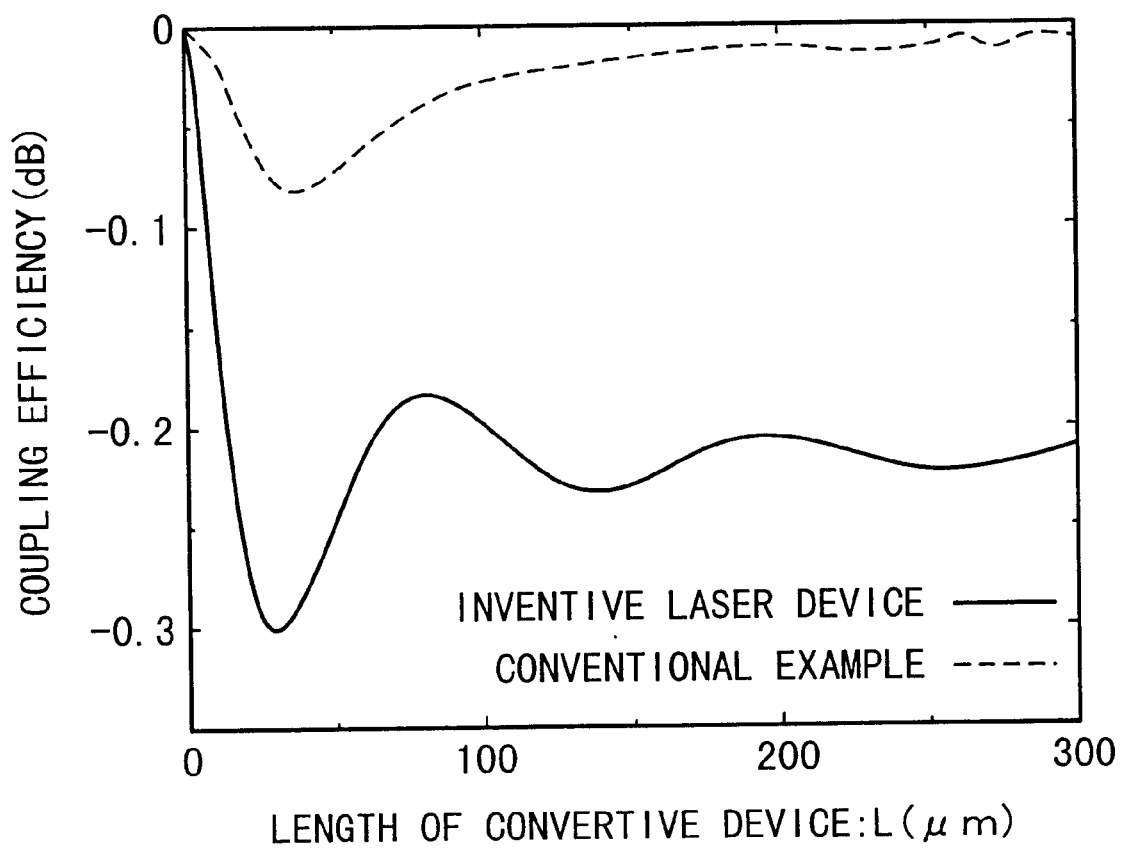
FIG. 6 is a graphic representation for showing a coupling efficiency for the one round trip in the semiconductor laser according to the first embodiment.

FIG. 6 graphically show a coupling efficiency calculated by the 2-D BPM in such a case that the laser light reflected at the front edge surface is again coupled to the first straight active layer region 105 having the width "w1". It is similar to the calculation result related to the correlative relationship between the length "L" of the converting device and the coupling loss with respect to the single-mode optical fiber. While the length "L" of the converting device is varied, the coupling efficiency is attenuation-oscillated, due to the relationship between the phase of the waveguide mode and the phase of the radiation mode of laser light. When the length "L" of the converting device is set to 60 micrometers to maximize the coupling efficiency with respect to the optical fiber, the phase of the laser light in the waveguide mode is substantially opposite to the phase of the laser light in the radiation mode.

As a consequence, since the beam diameter becomes narrow, the laser beam can be readily coupled to the first straight active layer region 105 having the width "w1". As a result, the length of the spot-size converting region becomes 60 micrometer, namely can be shortened than, or equal to ⅕ of the conventional tapered active layer. Also, the loss of the laser light which is propagated while said laser light once goes to and returns the resonator of the semiconductor laser device becomes small, namely equal to approximately 0.2 dB.

As apparent from the foregoing description, in accordance with the first embodiment of the present invention, it is possible to realize the semiconductor laser device capable of having the low threshold value, the high efficiency, and the high coupling efficiency even under high temperatures.

Next, a semiconductor laser device according to a second embodiment of the present invention will be described below.

Figure 7:
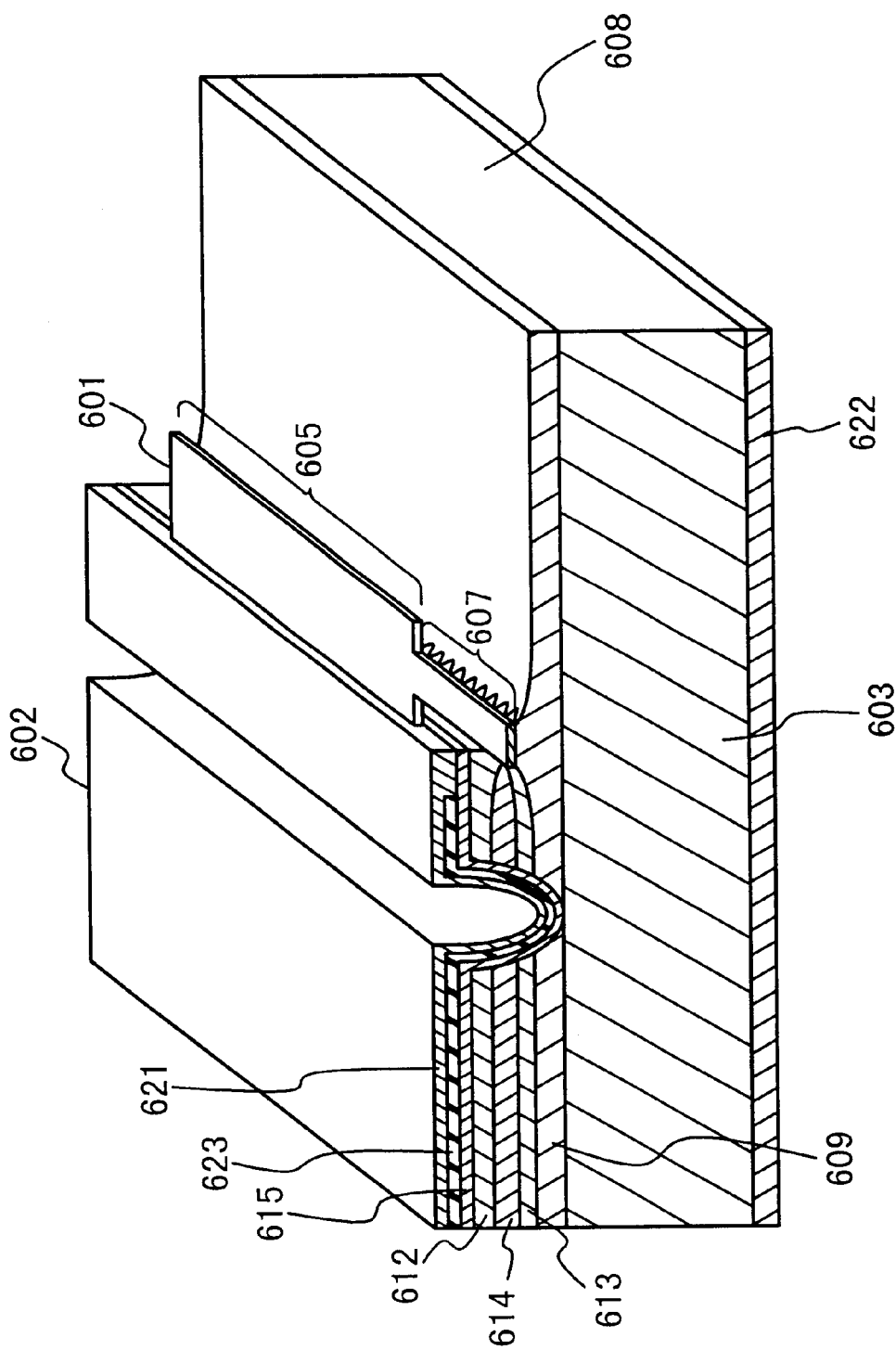
FIG. 7 illustratively shows a semiconductor laser device according to the second embodiment of the present invention.

FIG. 7 illustratively shows a semiconductor laser device according to the second embodiment of the present invention.

A description will now be made of the overall structure of this second semiconductor laser device with reference to FIG. 7.

As illustrated in this drawing, an N type clad layer 609 and the below-mentioned diffraction grating 617 are formed on an N type substrate 608.

Both an active layer 601 and a current blocking layer are formed on the N type clad layer 609.

A P type clad layer 610 is formed on the active layer 601.

The current blocking layer is constructed of a P type current blocking layer 613 located at a lower layer and a N type current blocking layer 614 located at an upper layer.

A P type buried layer 612 is provided on both the P type clad layer 610 and the current blocking layer.

A P type contact layer 615 is formed on the P type buried layer 612.

An insulating layer 623 is formed on the P type contact layer 615. An opening is formed in the insulating layer 623, and the opening is formed over the active layer 601.

Furthermore, a P type electrode 621 is formed on all of the opening, the P type contact layer 615, and the insulating layer 623.

The P type contact layer 615 owns a function capable of reducing a contact resistance with respect to the P type electrode 621.

Also, an N type electrode 622 is formed on a lower surface of the N type substrate 608.

A DC voltage is applied to the semiconductor laser device according to a second embodiment of the present invention by using both the P type electrode 621 and an N type electrode 622.

Furthermore, a film 603 having a low reflective power is provided on a front surface of the semiconductor laser device according to a second embodiment of the present invention.

Also, a film 602 having a high reflective power is provided on a rear surface of the semiconductor laser device according to a second embodiment of the present invention.

FIGS. 8A and 8B illustratively show a shape of the active layer 601 in the semiconductor laser device according to the second embodiment of the present invention.

A description will now be made of the structure of the active layer 601 according to the second embodiment of the present invention with reference to FIGS. 8A and 8B.

FIG. 8A is a top view of the active layer 601, and FIG. 8B is a sectional view of the active layer 601.

The active layer 601 is formed to oscillate laser light having a wavelength of λ micrometer in response to an application of a DC voltage.

Referring now to FIGS. 8A and 8B, the active layer 601 is composed of a first straight active layer region 605 and a second straight active layer region 607.

The shape of the first straight active layer region 605 and the second straight active layer region 607 represent either rectangular shapes or substantially rectangular shapes.

A width "w2" of the second straight active layer region 607 is narrower than a width "w1" of the first straight active layer region 605.

In case that laser light oscillated by the above-described active layer 601 is propagated in a single mode through an optical waveguide of the above-described active layer 601, the spot size of the laser light is extended at the first straight active layer region 605. This is an object of the present invention.

Especially, the active layer 601 oscillates laser light having a wavelength of λ micrometer, and when the width of the first straight active layer region 605 is formed to be made of 0.923×λ micrometer and the width of the second straight active layer region 607 is formed to be made of 0.462×λ micrometer, it will be interfered between a waveguide mode and a radiation mode of the laser light oscillated at the active layer 601 of the semiconductor laser device according to the second embodiment of the present invention.

In addition, the diffraction grating 617 is formed on the N type substrate under the second straight active layer region 607, as shown in FIG. 8B.

The diffraction grating 617 owns an interval of "T". When a wavelength of laser light emitted from the semiconductor laser device according to the second embodiment of the present invention is equal to λ micrometer, the diffraction grating 617 is formed to be equal to λ/6.384 micrometer of the interval "T".

The above-explained second semiconductor laser device owns the following different feature from that of the first semiconductor laser device. That is, the diffraction grating 617 is newly provided on the N type substrate 608 under the second straight active layer region 607.

Next, a description will now be made for manufacturing the semiconductor laser device according to the second embodiment of the present invention.

This second manufacturing method of the present invention is further including a step of forming the diffraction grating 617 on the N type substrate 608 corresponding to the lower portion of the second active region 607 by way of the electron beam exposure method in addition to the first manufacturing method of the present invention.

Next, a description will now be made of operations of the above-described semiconductor laser device according to the second embodiment of the present invention.

First, as shown in FIGS. 8A and 8B, in the semiconductor laser device of the second embodiment of the present invention, the active layer 601 is composed of the first straight active layer region 605 and the second straight active layer region 607.

Also, the width "w2" of the second straight active layer region 607 is narrower than the width "w1" of the first straight active layer region 605.

Laser light emitted from the active layer 601 is propagated to the first straight active layer region 605. And then the laser light is coupled to both the waveguide mode of the second straight active layer region 607 and the radiation mode thereof at a junction portion between the first straight active layer region 605 and the second straight active layer region 607. Since the transmission constant of the waveguide mode is different from that of the radiation mode, the laser light in the waveguide mode will interfere with the laser light in the radiation mode while two sets of the laser light are transmitted along the second straight active layer region 607. When the length of the second straight active layer region 607 is determined in such a manner that these two modes have an in-phase relationship, the spot size of the laser light at the edge surface of the second straight active layer region 607 is extended. As the result, the coupling efficiency of the laser light to the optical fiber can be increased.

Moreover, since the interference effect caused by the diffraction grating 617 is added to the effect of the first embodiment, the peak of the wavelength of the oscillated laser light is sharpened.

Next, a concrete example of the semiconductor laser device according to the second embodiment of the present invention will now be explained. In this second concrete example, the oscillating wavelength of the laser light is selected to be a length of 1.3 micrometer in response to an application of a DC voltage higher than, or equal to a preselected DC voltage.

This second concrete example of the semiconductor laser device is further including the diffraction grating 617 in addition to the first concrete example of the present invention. The diffraction grating 617 is formed to have the interval "T" of 204.3 nanometers. And the diffraction grating 617 is formed on the N type substrate 608 corresponding to the lower portion of the second active region 607.

Also, a method of manufacturing this second concrete example of the semiconductor laser device is further including a step of forming the diffraction grating 617 in addition to the method of manufacturing the first concrete example of the present invention. The diffraction grating 617 is formed to have the interval "T" of 204.3 nanometers by way of the electron beam exposure method. And the diffraction grating 617 is formed on the N type substrate 608 corresponding to the lower portion of the second active region 607.

When a pre-selected voltage was applied to the second concrete example of the semiconductor laser device according to the second embodiment of the present invention, this second concrete semiconductor laser device oscillates laser light having the wavelength of 1.31 micrometer.

Also, a sub mode suppression ratio is 45 dB which may compose an index of a stability for a single-mode oscillation. Also, when the current-to-light output characteristics of this second concrete semiconductor laser device was evaluated, this laser device was oscillated under condition of room temperature, the threshold current value was 4.0 mA, and also the light emitting efficiency represented 0.5 W/A. Moreover this laser device was oscillated under temperature condition of 85° C., the threshold current value was 15.0 mA, and also the light emitting efficiency represented 0.38 W/A. Also, even under temperature condition of 85° C., more than 40 mW light output power could be obtained.

Moreover, as a measurement result of the coupling efficiency between this semiconductor laser device and a single-mode optical fiber having a core diameter of 10 micrometers, the coupling efficiency of −4.0 dB could be obtained in maximum. Also, in such a case that the center of the active layer of this semiconductor laser device is located apart from the center of the above-explained optical fiber by approximately 2.5 micrometers on the coupling surface, coupling efficiency was reduced by 1 dB.

Figure 1A:
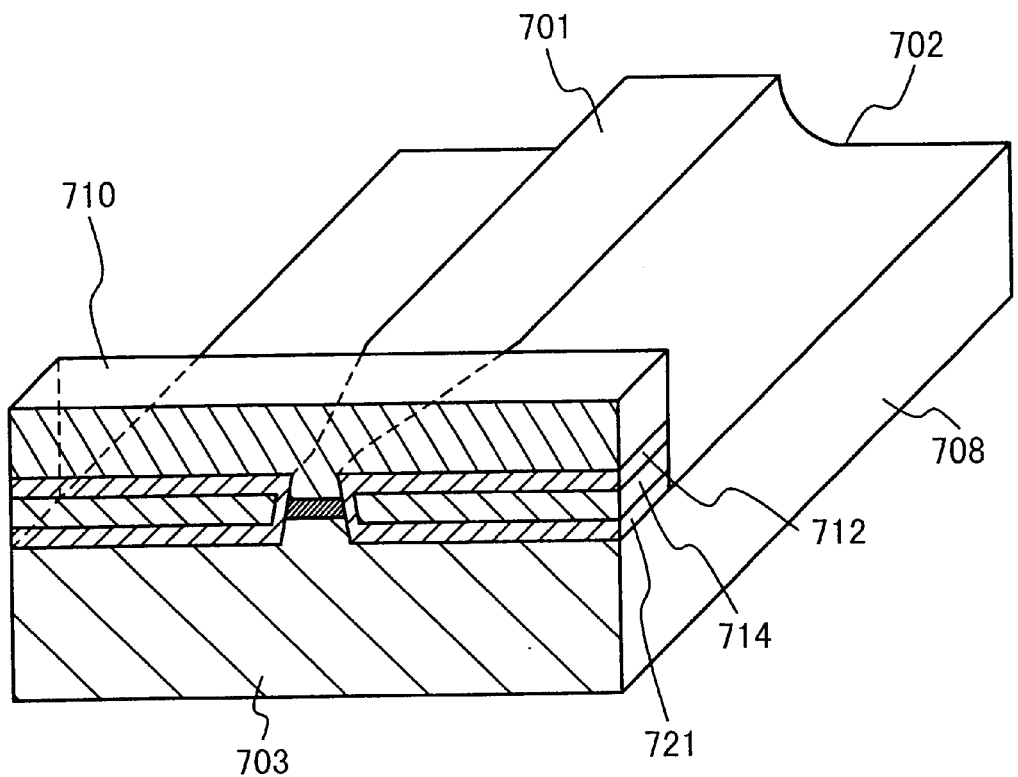
FIGS. 1A and 1B illustratively show the structure of the conventional lateral active taper type spot-size conversion laser.
Figure 1B:
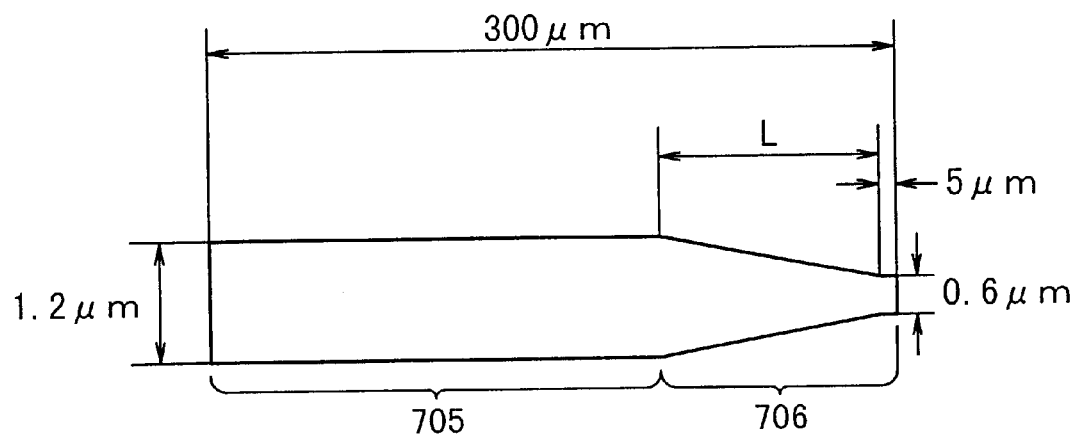

As apparent from the forgoing description, in accordance with the second embodiment of the present invention, it is possible to realize the second semiconductor laser device capable of having the low threshold value, the high efficiency, and the high coupling efficiency even under high temperatures. Furthermore, since the diffraction grating 617 is employed, it is also possible to realize such a higher coupling efficiency with respect to the single-mode optical fiber in addition to the single-mode characteristic similar to the conventional example shown in FIGS. 1A and 1B.

What is claimed is:

1. A semiconductor laser device comprising:
an electron carrying layer formed on a semiconductor substrate;
an active layer including a first straight active layer region having a first width and a second straight active layer region having a second width, and formed on said electron carrying layer in contact with said active layer, wherein said first straight active layer region is joined to said second active layer region, said second width is narrower than said first width, and said active layer radiates laser light in response to an application of a voltage higher than or equal to a predetermined voltage; wherein said first width and said second width are predetermined such that said laser light in a waveguide mode interferes with said laser light in a radiation mode in said second straight active layer region, and the entire waveguide is a single mode; and
a hole carrying layer formed on said active layer in contact with said active layer.

2. A semiconductor laser device comprising:
an electron carrying layer formed on a semiconductor substrate;
an active layer including a first straight active layer region having a first width and a second straight active layer region having a second width, and formed on said electron carrying layer in contact with said active layer, wherein said first straight active layer region is joined to said second active layer region, said second width is narrower than said first width, and said active layer radiates laser light in response to an application of a voltage higher than or equal to a predetermined voltage; wherein said first width and said second width are predetermined such that said laser light in a waveguide mode interferes with said laser light in a radiation mode in said second straight active layer region; and
a hole carrying layer formed on said active layer in contact with said active layer;
wherein said active layer radiates laser light of a wavelength of λ micrometers, said first width of said first straight active layer region is substantially 0.923×λ micrometers, and second width of said second active layer is substantially 0.462×λ micrometers.

3. A semiconductor laser device comprising:
an electron carrying layer formed on a semiconductor substrate;
an active layer including a first straight active layer region having a first width and a second straight active layer region having a second width, and formed on said electron carrying layer in contact with said active layer, wherein said first straight active layer region is joined to said second active layer region, said second width is narrower than said first width, and said active layer radiates laser light in response to an application of a voltage higher than or equal to a predetermined voltage; wherein said first width and said second width are predetermined such that said laser light in a waveguide mode interferes with said laser light in a radiation mode in said second straight active layer region; and
a hole carrying layer formed on said active layer in contact with said active layer;
wherein said active layer radiates laser light of substantially a 1.3 micrometers wavelength, said first straight active layer region has said first width of substantially 1.2 micrometers, and said second active layer has said second width of substantially 0.6 micrometers.

4. A semiconductor laser device comprising:
an electron carrying layer formed on a semiconductor substrate;
an active layer including a first straight active layer region having a first width and a second straight active layer region having a second width, and formed on said electron carrying layer in contact with said active layer, wherein said first straight active layer region is joined to said second active layer region, said second width is narrower than said first width, and said active layer radiates laser light in response to an application of a voltage higher than or equal to a predetermined voltage; wherein said first width and said second width are predetermined such that said laser light in a waveguide mode interferes with said laser light in a radiation mode in said second straight active layer region; and
a hole carrying layer formed on said active layer in contact with said active layer;
wherein said second active region has a length such that a phase of said laser light in said waveguide mode is equal to a phase of said laser light in said radiation mode in said second active region.

5. A semiconductor laser device comprising:
an electron carrying layer formed on a semiconductor substrate;
an active layer including a first straight active layer region having a first width and a second straight active layer region having a second width, and formed on said electron carrying layer in contact with said active layer, wherein said first straight active layer region is joined to said second active layer region, said second width is narrower than said first width, and said active layer radiates laser light in response to an application of a voltage higher than or equal to a predetermined voltage; wherein said first width and said second width are predetermined such that said laser light in a waveguide mode interferes with said laser light in a radiation mode in said second straight active layer region; and
a hole carrying layer formed on said active layer in contact with said active layer;
and further comprising:
a current blocking layer formed between said electron carrying layer and said hole carrying layer.

6. A semiconductor laser device according to claim 5, wherein said current blocking layer comprises:
  a hole blocking layer formed on said electron carrying layer; and
  an electron blocking layer formed on said electron carrying layer; and
  an electron blocking layer formed on said hole blocking layer.

7. A semiconductor laser device according to claim 4, wherein said active layer has a length such that a power loss of said laser light is smaller than or equal to 0.3 dB, wherein said loss occurs while said laser light once goes and returns in said active layer.

8. A semiconductor laser device according to claim 1, further comprising:
  a diffraction grating formed under said second straight active layer region.

9. A semiconductor laser device comprising:
  an electron carrying layer formed on a semiconductor substrate;
  an active layer including a first straight active layer region having a first width and a second straight active layer region having a second width, and formed on said electron carrying layer in contact with said active layer, wherein said first straight active layer region is joined to said second active layer region, said second width is narrower than said first width, and said active layer radiates laser light in response to an application of a voltage higher than or equal to a predetermined voltage; wherein said first width and said second width are predetermined such that said laser light in a waveguide mode interferes with said laser light in a radiation mode in said second straight active layer region; and
  a hole carrying layer formed on said active layer in contact with said active layer;
  and further comprising a diffraction grating formed under said second straight active layer region;
  wherein said active layer radiates laser light of a wavelength of $\lambda$ micrometers and said diffraction grating has substantially an interval of $\lambda \div 6.364$ micrometers.

10. A semiconductor laser device comprising:
  an electron carrying layer formed on a semiconductor substrate;
  an active layer including a first straight active layer region having a first width and a second straight active layer region having a second width, and formed on said electron carrying layer in contact with said active layer, wherein said first straight active layer region is joined to said second active layer region, said second width is narrower than said first width, and said active layer radiates laser light in response to an application of a voltage higher than or equal to a predetermined voltage; wherein said first width and said second width are predetermined such that said laser light in a waveguide mode interferes with said laser light in a radiation mode in said second straight active layer region; and
  a hole carrying layer formed on said active layer in contact with said active layer;
  and further comprising a diffraction grating formed under said second straight active layer region;
  wherein said active layer radiates laser light of substantially a same wavelength as 1.3 micrometer and said diffraction grating has substantially a same interval as 204.3 nanometers.

11. A semiconductor laser device according to claim 1, wherein said semiconductor laser device is operated in a single mode such that a sub mode suppression ratio is lower than or equal to 50 dB.

12. A semiconductor laser device according to claim 1, wherein said first straight active layer region and said second straight active layer region each have a substantially rectangular shape, and, wherein a center line through said first active layer region aligns with a center line through said second active layer region.

* * * * *

UNITED STATES PATENT AND TRADEMARK OFFICE
CERTIFICATE OF CORRECTION

PATENT NO. : 6,542,532 B1 Page 1 of 1
DATED : April 1, 2003
INVENTOR(S) : Nakamura It is certified that error appears in the above-identified patent and that said Letters Patent is hereby corrected as shown below:

Column 16,
Line 48, "clcctron" should be -- electron --.

Signed and Sealed this

Twenty-fourth Day of August, 2004

JON W. DUDAS
*Director of the United States Patent and Trademark Office*